United States Patent [19]
Muroyama

[11] Patent Number: 6,066,573
[45] Date of Patent: May 23, 2000

[54] METHOD OF PRODUCING DIELECTRIC FILM

[75] Inventor: Masakazu Muroyama, Kanagawa, Japan

[73] Assignee: Sony Corporation, Tokyo, Japan

[21] Appl. No.: 09/119,967

[22] Filed: Jul. 21, 1998

[30] Foreign Application Priority Data

Jul. 22, 1997 [JP] Japan ................................. 9-195276

[51] Int. Cl.⁷ ..................... H01L 21/31; H01L 21/469
[52] U.S. Cl. ..................... 438/778; 438/623; 438/476; 438/758; 257/632; 257/758; 430/296
[58] Field of Search ............................. 438/476, 477, 438/623, 758, 778, 780, 781, 789, 790; 257/632, 758

[56] References Cited

U.S. PATENT DOCUMENTS

| | | | |
|---|---|---|---|
| 5,364,818 | 11/1994 | Ouellet | 438/476 |
| 5,484,687 | 1/1996 | Watanabe et al. | 430/296 |
| 5,604,380 | 2/1997 | Nishimura et al. | 257/758 |
| 5,899,751 | 4/1999 | Chang et al. | 438/758 |
| 5,924,005 | 7/1999 | Waldo | 438/623 |
| 5,949,130 | 9/1999 | Fukuyama et al. | 257/632 |

*Primary Examiner*—David Nelms
*Assistant Examiner*—Brook Kebede
*Attorney, Agent, or Firm*—Hill & Simpson

[57] ABSTRACT

A surface of a substrate is coated with a coating agent to form a coating film. The coating agent contains a material capable of generating moisture (for example, hydrogen-silsesquioxane or hydroxysilazane) and an additive capable of generating a gas by reaction with the moisture thus generated (for example, a material containing an isocyanate group). By heat-treatment of the substrate, moisture is generated from the coating film and a gas is discharged from the coating film by reaction between the moisture thus generated and the additive, to form fine voids in the coating film. Such a coating film is converted into a dielectric film having a low dielectric constant.

8 Claims, 1 Drawing Sheet

F I G. 1A
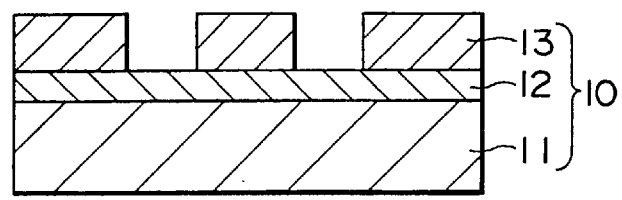
F I G. 1B
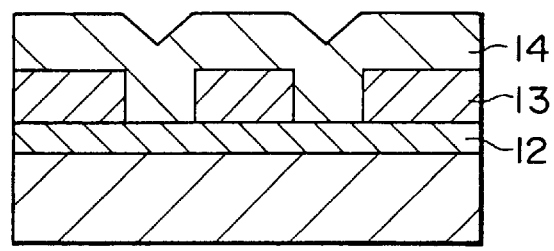
F I G. 1C
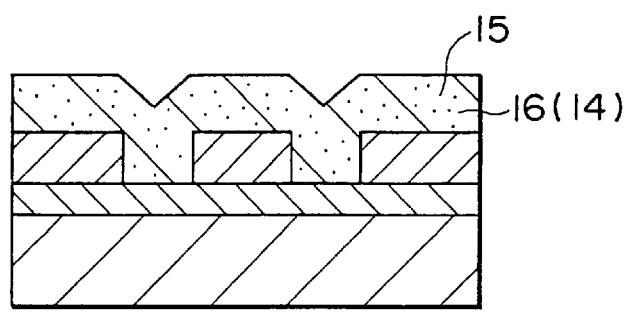

METHOD OF PRODUCING DIELECTRIC FILM

BACKGROUND OF THE INVENTION

The present invention relates to a method of producing a dielectric film, and particularly to a method of producing a dielectric film having a low dielectric constant used as an interlayer insulating film of a semiconductor device.

With progress of the finer design rule, there has been appointed a problem on a delay of an interlayer capacity due to an interlayer insulating film. To cope with such a problem, there is increasing the necessity to reduce a dielectric constant of an interlayer insulating film. A method for reducing a dielectric constant of an interlayer insulating film is disclosed in Japanese Patent Laid-open No. Hei 05-283542, wherein voids are positively formed in an interlayer insulating film to thereby reduce an effective dielectric constant. This method involves coating a surface of a substrate with a coating material in which a main material for forming an interlayer insulating film is mixed with fine particles of a material (aluminum, in this case) different from the main material, solidifying the coating film, and selectively etching the fine particles using an etchant allowed not to etch the main material but to etch the fine particles so as to form voids, thereby forming an interlayer insulating film in which the voids are dispersed throughout.

The above method of forming an interlayer insulating film, however, has a problem that metal fine particles remaining in the interlayer insulating film may cause short-circuit between interconnections, resulting in the reduced yield.

SUMMARY OF THE INVENTION

An object of the present invention is to provide a method of producing a dielectric film, which is capable of solving the above-described problem.

To achieve the above object, according to the present invention, there is provided a method of producing a dielectric film, comprising the steps of: coating a surface of a substrate with a coating material, to form a coating film thereon, said coating material being composed of a material capable of generating moisture and an additive capable of generating a gas by reaction with the moisture; generating moisture from said coating film; and generating a gas by reaction between the moisture thus generated and said additive. The step of generating the moisture from said coating film and said step of generating the gas by reaction between the moisture thus generated and said additive may be carried out by a heat-treatment. With this heat-treatment, a gas is generated in the coating film, to form voids in the coating film. As the material capable of generating the moisture, there may be used hydrogen-silsesquioxane hydride or hydroxysilazane, and as the additive, there may be used a material containing an isocyanate group.

In the method of producing a dielectric film, since voids are formed in a coating film by discharge of a gas generated in the coating film therefrom, the dielectric constant of the coating film is reduced by the presence of the voids and thereby the coating film is converted into a dielectric film having a low dielectric constant. In the case of using such a dielectric film as an interlayer insulating film, it is possible to reduce an electrostatic capacity between upper and lower interconnection layers and an electrostatic capacity between interconnections in the same interconnection layer. Also since hydrogen-silsesquioxane hydride or hydroxysilazane is used as the material capable of generating moisture and a material containing an isocyanate group is used as the additive, moisture is generated, by heat-treatment, from hydrogen-silsesquioxane hydride or hydroxysilazane in the coating film and a gas (carbon dioxide, in this case) is generated by reaction between the moisture thus generated and the isocyanate group in the additive. As a result, fine voids can be easily formed in the coating film by generation of the gas in the coating film. The coating film is converted into a silicon oxide based dielectric film, and therefore, such a film has a dielectric constant lower than that of a usual silicon oxide film. Further, since any conductive material is not contained in the coating material for forming the coating film, the dielectric film formed by the coating film does not cause short-circuit between interconnections.

BRIEF DESCRIPTION OF THE DRAWINGS

FIGS. 1A to 1C are process diagrams illustrating first and second embodiments of a method of producing a dielectric film according to the present invention.

DETAILED DESCRIPTION OF THE PREFERRED EMBODIMENTS

Hereinafter, preferred embodiments of the present invention will be described with reference to the accompanying drawings.

A first embodiment of the present invention will be described with reference to process diagrams shown in FIGS. 1A to 1C. In this embodiment, description will be made using a specific example in which a silicon oxide film as an inorganic insulating film is formed as a dielectric film. Such a dielectric film is usable as an interlayer insulating film between interconnection layers.

As shown in FIG. 1A, an insulating film 12 made from silicon oxide was formed on a semiconductor substrate (typically, silicon substrate) 11 to a thickness of 1 $\mu$m by a plasma CVD process and an interconnection layer 13 made from an aluminum based metal was formed on the insulating film 12 to a thickness of 650 nm, to prepare a substrate 10. It is to be noted that the interconnection layer 13 may be made from a copper based metal or a refractory metal.

The above insulating film 12 was coated with hydrogen-silsesquioxane hydride added with 5 wt % of triisocyanate by a spin coating process, to form a coating film 14 (which will be converted into a silicon oxide film later) having a thickness of about 900 nm in such a manner as to cover the interconnection layer 13. In this case, hydrogen-silsesquioxane hydride was used as a material capable of generating moisture, and triisocyanate was used as an additive capable of generating a gas by reaction with the moisture. In general, triisocyanate is obtained by reaction between glycerin and hexamethylenediisocyanate.

Then, as shown in FIG. 1C, the substrate 10 with film 14 was heated in atmospheric air to generate carbon dioxide in the coating film 14 by reaction (chemical reaction) between $H_2O$ generated from hydrogen-silsesquioxane hydride and triisocyanate. The heat-treatment in atmospheric air was performed at 400° C. for 30 min.

The substrate 10 with film 14 was then heated in vacuum to discharge carbon dioxide generated in the coating film 14, to form voids 15. The heat-treatment in vacuum was performed at 400° C. for 30 min. A dielectric film 16 having a low dielectric constant used as an interlayer insulating film, made from porous silicon oxide, was formed to a thickness of about 800 nm.

The relative dielectric constant of the dielectric film 16 obtained by the production method according to the first embodiment was measured, with a result that the relative dielectric constant was 3.5. This shows that the relative dielectric constant of the dielectric film 16 is made very lower than the relative dielectric constant (4.2) of the related art silicon oxide film.

While hydrogen-silsesquioxane hydride is used as an inorganic interlayer insulating material in the above production method, the present invention is not limited thereto. The heat-treatment condition can be suitably changed. The porosity and the size of each void can be controlled by adjustment of a composition of the material used.

In the method of producing a dielectric film according to the first embodiment, the voids 15 are formed in the coating film 14 by discharge of a gas having been generated in the coating film 14 therefrom. The presence of these voids 15 in the coating film 14 reduces the dielectric constant of the coating film 14, to form the dielectric film 16 having a low dielectric constant. By use of the dielectric film 16 as an interlayer insulating film, it is possible to reduce an electrostatic capacity between the lower interconnection layer 13 and an upper interconnection layer (not shown) and also to reduce an electrostatic capacity between interconnections in the same interconnection layer, for example, the lower interconnection layer 13. Thus, a high speed semiconductor device can be realized.

Since hydrogen-silsesquioxane hydride is used as the material capable of generating moisture and triisocyanate (containing the isocyanate group) is used as the additive, moisture is generated from hydrogen-silsesquioxane hydride in the coating film 14 by heat-treatment and the moisture thus generated reacts with the isocyanate group of triisocyanate to generate a gas (carbon dioxide, in this case). As a result, the fine voids 15 are easily formed in the coating film 14 in a state being dispersed throughout. Further, the coating film 14 is converted into the silicon oxide based dielectric film 16. Thus, the dielectric film having a dielectric constant lower than that of the usual silicon oxide film can be formed.

Like the first embodiment, a second embodiment of the present invention will be described with reference to process diagrams shown in FIGS. 1A to 1C. In this embodiment, like the first embodiment, description will be made using a specific example in which a silicon oxide film as an inorganic insulating film is formed as a dielectric film. Such a dielectric film is usable as an interlayer insulating film between interconnection layers.

As shown in FIG. 1A, an insulating film 12 made from silicon oxide was formed on a semiconductor substrate (typically, silicon substrate) 11 and an interconnection layer 13 made from an aluminum based metal, a copper based metal or a refractory metal was formed on the insulating film 12 to a thickness of about 650 nm.

The above insulating film 12 was coated with hydroxysilazane added with 7 wt % of triisocyanate by spin coating, to form a coating film 14 (which will be converted into a silicon oxide film later) having a thickness of about 900 nm in such a manner as to cover the interconnection layer 13. That is to say, hydoxysilazane was used as a material capable of generating moisture, and triisocyanate was used as an additive capable of generating a gas by reaction with the moisture.

Then, as shown in FIG. 1C, the substrate 10 with film 14 was heated in a steam atmosphere to generate carbon dioxide in the coating film 14 by reaction (chemical reaction) between $H_2O$ and triisocyanate. The heat-treatment in the steam atmosphere was performed at 400° C. for 30 min.

The substrate 10 with film 14 was then heated in vacuum to discharge carbon dioxide generated in the coating film 14, to form voids 15. The heat-treatment in vacuum was performed at 400° C. for 30 min. A dielectric film 16 having a low dielectric constant used as an interlayer insulating film, made from porous silicon oxide, was formed to a thickness of about 800 nm.

The relative dielectric constant of the dielectric film 16 obtained by the above production method was measured, with a result that the relative dielectric constant was 3.2. This shows that the relative dielectric constant of the dielectric film 16 is made very lower than the relative dielectric constant (4.2) of the related art silicon oxide film.

While hydroxysilazane is used as an inorganic interlayer insulating material in the above production method according to the second embodiment, the present invention is not limited thereto. The heat-treatment condition can be suitably changed. The porosity and the size of each void can be controlled by adjustment of a composition of the material used.

In the method of producing a dielectric film according to the second embodiment, the voids 15 are formed in the coating film 14 by discharge of a gas having been generated in the coating film 14 therefrom. The presence of these voids 15 in the coating film 14 reduces the dielectric constant of the coating film 14, to form the dielectric film 16 having a low dielectric constant. By use of the dielectric film 16 as an interlayer insulating film, it is possible to reduce an electrostatic capacity between the lower interconnection layer 13 and an upper interconnection layer (not shown) and also to reduce an electrostatic capacity between interconnections in the same interconnection layer, for example, the lower interconnection layer 13. Thus, a high speed semiconductor device can be realized.

Since hydroxysilazane is used as the material capable of generating moisture and triisocyanate (containing the isocyanate group) is used as the additive, moisture is generated from hydroxysilazane in the coating film 14 by heat-treatment and the moisture thus generated reacts with the isocyanate group of triisocyanate to generate a gas (carbon dioxide, in this case). As a result, the fine voids 15 are easily formed in the coating film 14 in a state being dispersed throughout. Further, the coating film 14 is converted into the silicon oxide based dielectric film 16. Thus, the dielectric film having a dielectric constant lower than that of the usual silicon oxide film can be formed.

Incidentally, there is known a method of forming a low dielectric constant film made from fluorosilicon oxide (SiOF) by adding hexafluoroethane ($C_2F_6$) as a fluorine (F) source to tetraethoxysilane (TEOS)[$Si(OC_2H_5)_4$], which is disclosed in the 25th SSDM (Solid-State Device Meeting) (1993), p161. Further, there is known a method of forming a low dielectric film made from SiOF by adding nitrogen fluoride ($NF_3$) to TEOS, which is disclosed in the Abstract (1a-ZV-9) of the 40th Meeting of Associated Organization of Applied Physics Institute. The low dielectric films obtained by the above methods, however, have a problem that since the film contains fluorine, the film quality becomes poor with an increase in the added amount of fluorine, with a result that the hygroscopic property of the film is significantly degraded. On the contrary, since the dielectric film 16 having a low dielectric constant formed by the production method according to each of the first and second embodiments doe not contain fluorine, it does not present the above problem.

Further, in a related art air gap structure, a column portion for supporting an upper interconnection layer is required to be formed because a gap between the upper interconnection layer and a low interconnection layer is taken as an air layer. Accordingly, the column portion must be basically electrically isolated from lower interconnection layers other than the uppermost interconnection layer in multi-layer interconnection structure. This causes a problem that the interconnection structure is significantly complicated, leading to a difficulty in terms of production. However, since the dielectric film 16 formed by the production method according to each of the first and second embodiments is not required to form the above column portion, it can be easily produced.

As described above, according to the present invention, since a gas is generated in a coating film by reaction between moisture generated from the coating film and an additive, fine voids can be easily formed in the coating film by discharge of the gas from the coating film therefrom, so that the coating film is converted into a dielectric film with its dielectric constant reduced by the presence of the voids. Accordingly, the dielectric film having a good film quality and having a low dielectric constant can be simply produced. Further, since any conductive material is not contained in a coating material for forming the coating film, the dielectric film formed from the coating film does not cause short-circuit, to thus improve the yield.

The use of the dielectric film formed by the production method of the present invention as an interlayer insulating film reduces an electrostatic capacity between upper and lower interconnection layers and an electrostatic capacity between interconnections in the same interconnection layer; decreases a delay time in interlayer capacity due to an interlayer insulating film; and lowers the power consumption. Thus, it is possible to easily form a high speed semiconductor integrated circuit with the reduced capacity between interconnections.

While the preferred embodiments have been described using the specific terms, such description is for illustrative purposes only, and it is to be understood that many changes and variations may be made without departing from the scope or spirit of the following claims.

What is claimed is:

1. A method of producing a dielectric film, comprising the steps of:

coating a surface of a substrate with a coating material, to form a coating film thereon, said coating material being composed of a material capable of generating moisture and an additive capable of generating a gas by reaction with the moisture;

generating moisture from said coating film; and generating a gas by reaction between the moisture thus generated and said additive.

2. A method of producing a dielectric film according to claim 1, wherein said step of generating the moisture from said coating film and said step of generating the gas by reaction between the moisture generated and said additive are carried out by a first heat-treatment.

3. A method of producing a dielectric film according to claim 2, wherein said first heat-treatment is carried out in atmospheric air.

4. A method of producing a dielectric film according to claim 2, wherein said first heat-treatment is carried out in a steam atmosphere.

5. A method of producing a dielectric film according to claim 3, wherein a second heat-treatment is carried out in vacuum after said first heat-treatment.

6. A method of producing a dielectric film according to claim 4, wherein a second heat-treatment is carried out in vacuum after said first heat-treatment.

7. A method of producing a dielectric film according to claim 1, wherein said material capable of generating the moisture comprises hydrogen-silsesquioxane hydride or hydroxysilazane.

8. A method of producing a dielectric film according to claim 1, wherein said additive comprises a material containing an isocyanate group.

* * * * *